(12) United States Patent
Tuttle et al.

(10) Patent No.: US 6,621,717 B2
(45) Date of Patent: Sep. 16, 2003

(54) REMOVABLE EMI COVER FOR A MEDIA DRIVE HOUSING

(75) Inventors: Erick J. Tuttle, Fort Collins, CO (US); Tom J Searby, Greeley, CO (US)

(73) Assignee: Hewlett-Packard Development, L.P., Houston, TX (US)

( * ) Notice: Subject to any disclaimer, the term of this patent is extended or adjusted under 35 U.S.C. 154(b) by 0 days.

(21) Appl. No.: 10/020,059

(22) Filed: Oct. 29, 2001

(65) Prior Publication Data

US 2003/0081398 A1 May 1, 2003

(51) Int. Cl.$^7$ ................................................ H05K 9/00
(52) U.S. Cl. ................ 361/818; 361/800; 361/816; 174/35 R; 220/241
(58) Field of Search ................. 361/800, 816, 361/818; 174/66, 67, 35 R; 220/241

(56) References Cited

U.S. PATENT DOCUMENTS

| | | | | |
|---|---|---|---|---|
| 3,278,066 A | * | 10/1966 | George et al. | 220/241 |
| 5,243,493 A | * | 9/1993 | Jeng et al. | 361/690 |
| 5,423,605 A | * | 6/1995 | Liu | 312/265.6 |
| 5,593,220 A | * | 1/1997 | Seid et al. | 312/265.6 |
| 5,926,916 A | * | 7/1999 | Lee et al. | 16/230 |
| 6,339,536 B1 | * | 1/2002 | Buican et al. | 361/818 |
| 6,385,055 B1 | * | 5/2002 | Kramer et al. | 361/816 |
| 6,390,320 B2 | * | 5/2002 | Hurst et al. | 220/241 |

\* cited by examiner

Primary Examiner—Jayprakash N. Gandhi
(74) Attorney, Agent, or Firm—Kevin M. Hart (57) ABSTRACT

An EMI cover for a media drive housing. The cover includes a conductive surface adapted to cover one end of the housing. Conductive flanges are disposed along the sides of the surface. A first flange hingingly engages the housing. A second flange catchingly engages the housing. Attachment and removal of the cover may be achieved without the use of fasteners or tools. Protrusions disposed along the periphery of the cover enhance EMI blocking characteristics of the cover. A raised section of one of the flanges may extend over a portion of the housing to form an EMI-efficient cable management port.

25 Claims, 10 Drawing Sheets

REMOVABLE EMI COVER FOR A MEDIA DRIVE HOUSING

FIELD OF THE INVENTION

This invention relates to reducing the emission of electromagnetic energy from enclosures for electronic systems such as computers.

BACKGROUND

One of the challenges in the design of electronic system enclosures such as computer enclosures is to contain the emission of electromagnetic energy to an acceptable degree. Excessive emission of electromagnetic energy can result in electromagnetic interference ("EMI") with other electronic systems. For this reason, laws and regulations exist to prohibit excessive EMI production by various kinds of devices; manufacturers must comply with such laws and regulations in the design of their products.

It is common to use sheet metal to form an enclosure because the sheet metal forms a Faraday cage, effectively containing EMI inside the enclosure. Unfortunately, any useful enclosure must include openings for mounting components, such as media drives and cables, that need to be accessible through or from the outside of the enclosure. Such openings in the sheet metal provide opportunities for EMI to escape, particularly when such openings are not populated with a component.

A need therefore exists for a technique that would enable components such as media drives and their cables to be mounted in a computer enclosure while at the same time effectively containing the escape of EMI from the enclosure.

SUMMARY OF THE INVENTION

In one aspect, the invention includes a conductive media drive housing having a removable rear EMI cover. When installed in an enclosure, the media drive housing and rear cover reduce the amount of EMI that can escape from the enclosure through the media drive bay opening. The media drive housing and rear cover are effective for reducing EMI whether or not a media drive is actually installed in the housing.

In another aspect, the invention includes the removable EMI cover itself. Made from a conductive material such as sheet metal, the EMI cover includes a surface for covering one end of the media drive housing. Flanges are disposed along the sides of the surface. A first one of the flanges is adapted to hingingly engage a first surface on the end of the media drive housing. A second one of the flanges is adapted to catchingly engage a second surface on the end of the media drive housing. Once the first flange is hingingly engaged with the housing, the cover may be rotated into a closed position in which the second flange catchingly engages the housing, thus securing the cover to the housing. To remove the cover from the housing, the catch is released and the cover is rotated into an open position from which it may be separated from the housing. Attachment of the cover to the housing is achieved without the use of fasteners, and removal of the cover may be accomplished by hand.

In another aspect, the hinging engagement between the cover and the housing may be accomplished with holes (or teeth) on the first flange that engage corresponding teeth (or holes) on the first surface on the end of the housing. The catching engagement between the cover and the housing may be accomplished with one or more detents (or holes) on the second flange that engage corresponding holes (or detents) on the second surface on the end of the housing. Protrusions disposed along the periphery of the cover may be provided to make conductive contact at corresponding points on the end of the housing, thus enhancing the EMI blocking characteristics of the cover.

In still another aspect, a cable management port may be provided without substantially impairing the EMI-blocking characteristics of the cover and housing: A flange of the cover may include a raised section through which a cable assembly may pass. The raised section may extend over a portion of the media drive housing when the cover is installed thereon, thereby defining a first channel. Enhanced EMI-blocking characteristics are achieved when the height and width of the channel so defined are not substantially greater than the height and width of the cable assembly. A second channel may be formed between an inside surface of the cover and a cable flange formed at the end of the housing. Further enhanced EMI-blocking characteristics are achieved when the first and second channels, end-to-end, form a combined channel having at least a 90-degree bend therein.

DETAILED DESCRIPTION OF THE PREFERRED EMBODIMENTS

Figure 1:
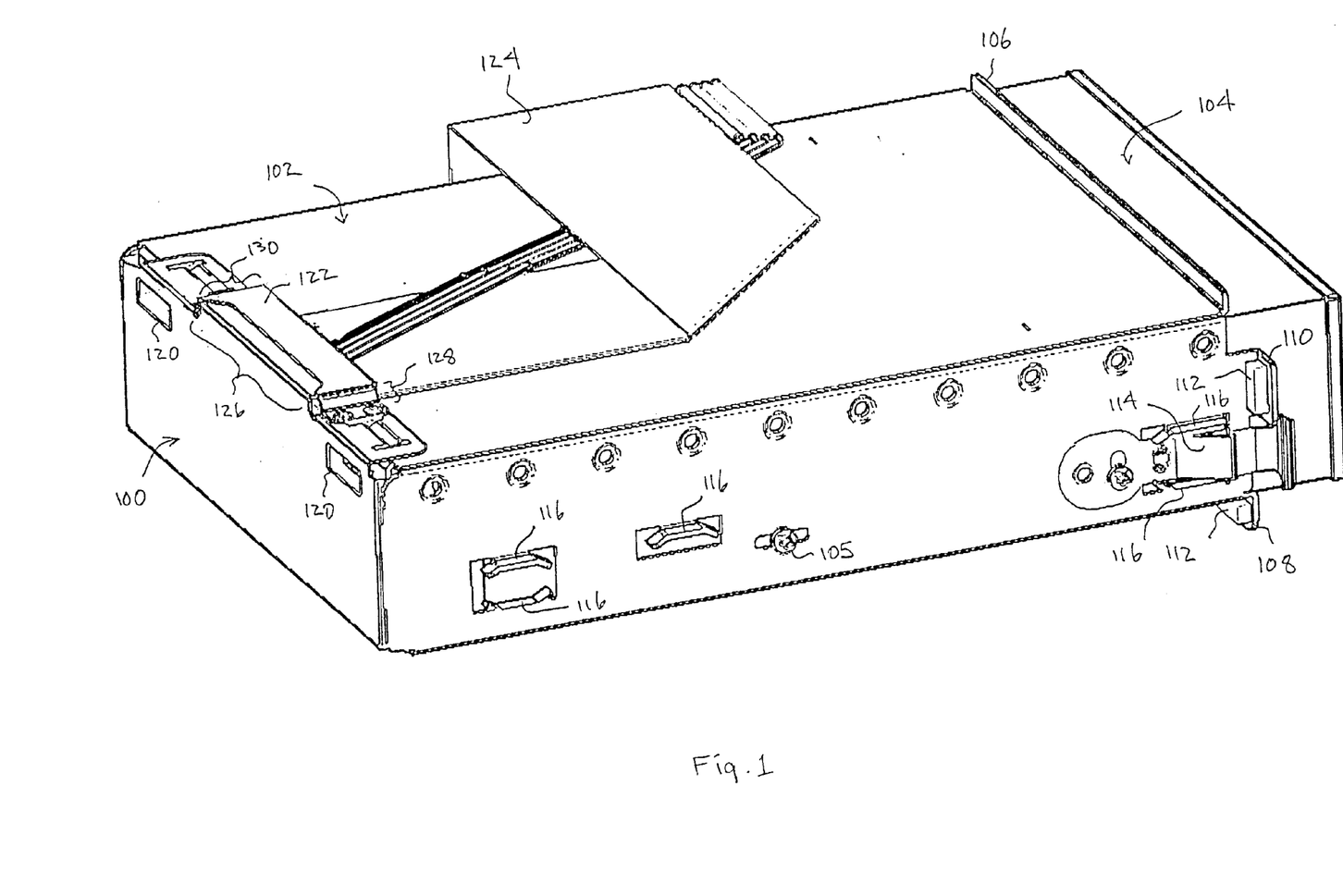
FIG. 1 is an oblique view of a media drive housing having a removable EMI cover according to a preferred embodiment of the invention, illustrated with a media drive installed therein.

FIG. 1 illustrates a conductive EMI cover 100 installed on the back end of a media drive housing 102 according to a preferred embodiment of the invention. In the illustration, a media drive 104 such as a magnetic disk or tape drive or an optical disk drive is installed inside housing 102 and protrudes partially at the front end of housing 102. Preferably, housing 102 is enclosed on four sides, leaving the back end at least partially open for cable access and leaving the front end open to receive media drive 104. Media drive 104 may be anchored within housing 102 by means of screws 105 or other suitable fasteners. For effective EMI shielding, housing 102 may be formed from, or lined with, a conductive material such as sheet metal (typically steel or aluminum).

In the illustrated embodiment, top and bottom flanges 106, 108 and side t flanges 110 are disposed along the edges of the front end of housing 102. EMI gasket material 112 may be attached to some or all of the flanges. In the illustrated embodiment, gasket material is attached to flanges 108 and 110, and flange 106 is adapted to make contact with a corresponding gasket attached to the host computer chassis. In the illustrated embodiment, gasket material 112 is a resilient foam covered with a conductive fabric. Gasket material 112 may be applied to the flanges using adhesive or another suitable fastening technique. (Other types of gasket materials may, of course, be used. Optionally, the gasket material may be omitted.)

Figure 2:
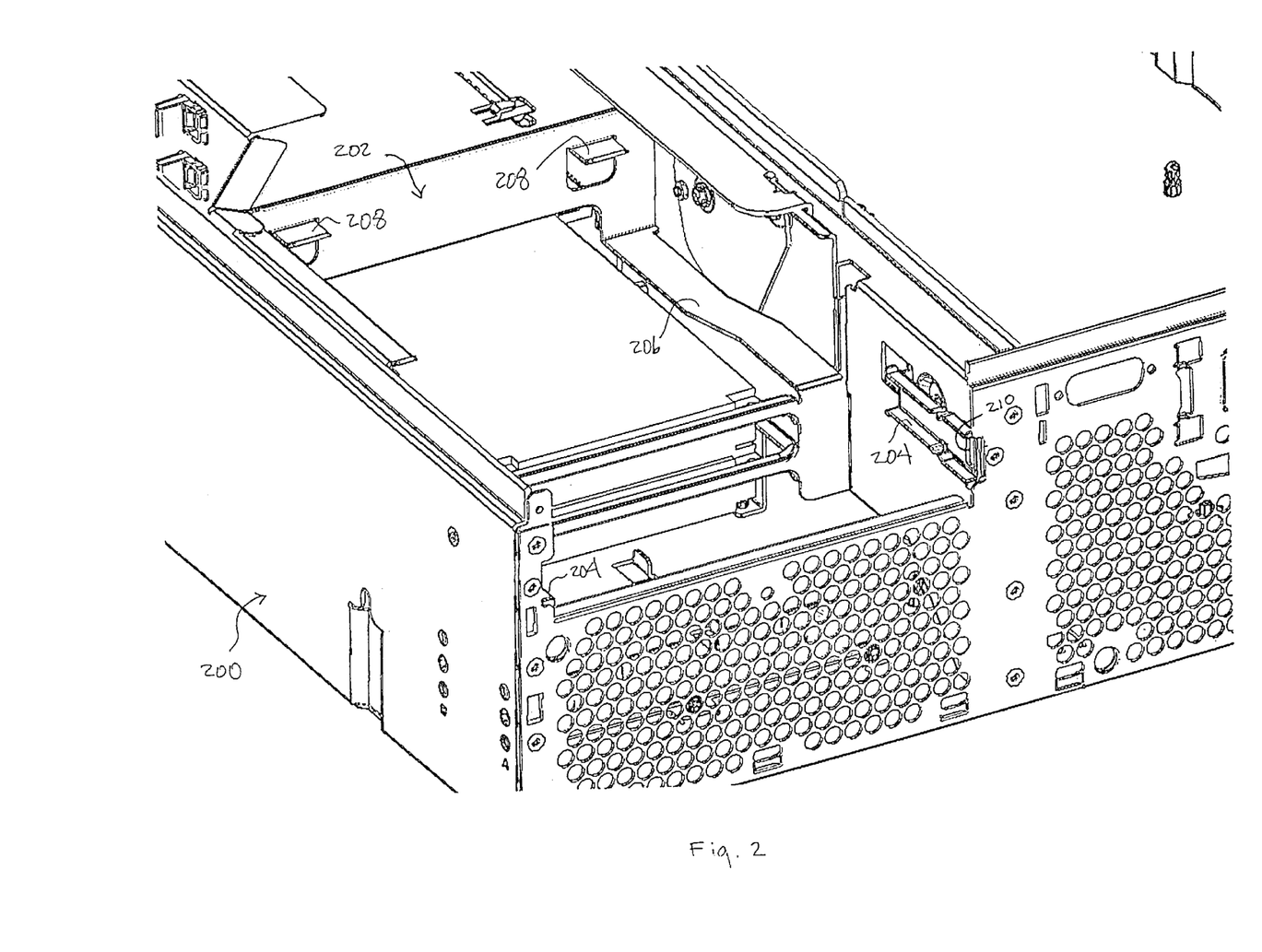
FIG. 2 is an oblique view of a media drive bay in a computer enclosure suitable for receiving the media drive housing of FIG. 1 according to a preferred embodiment of the invention.
Figure 3:
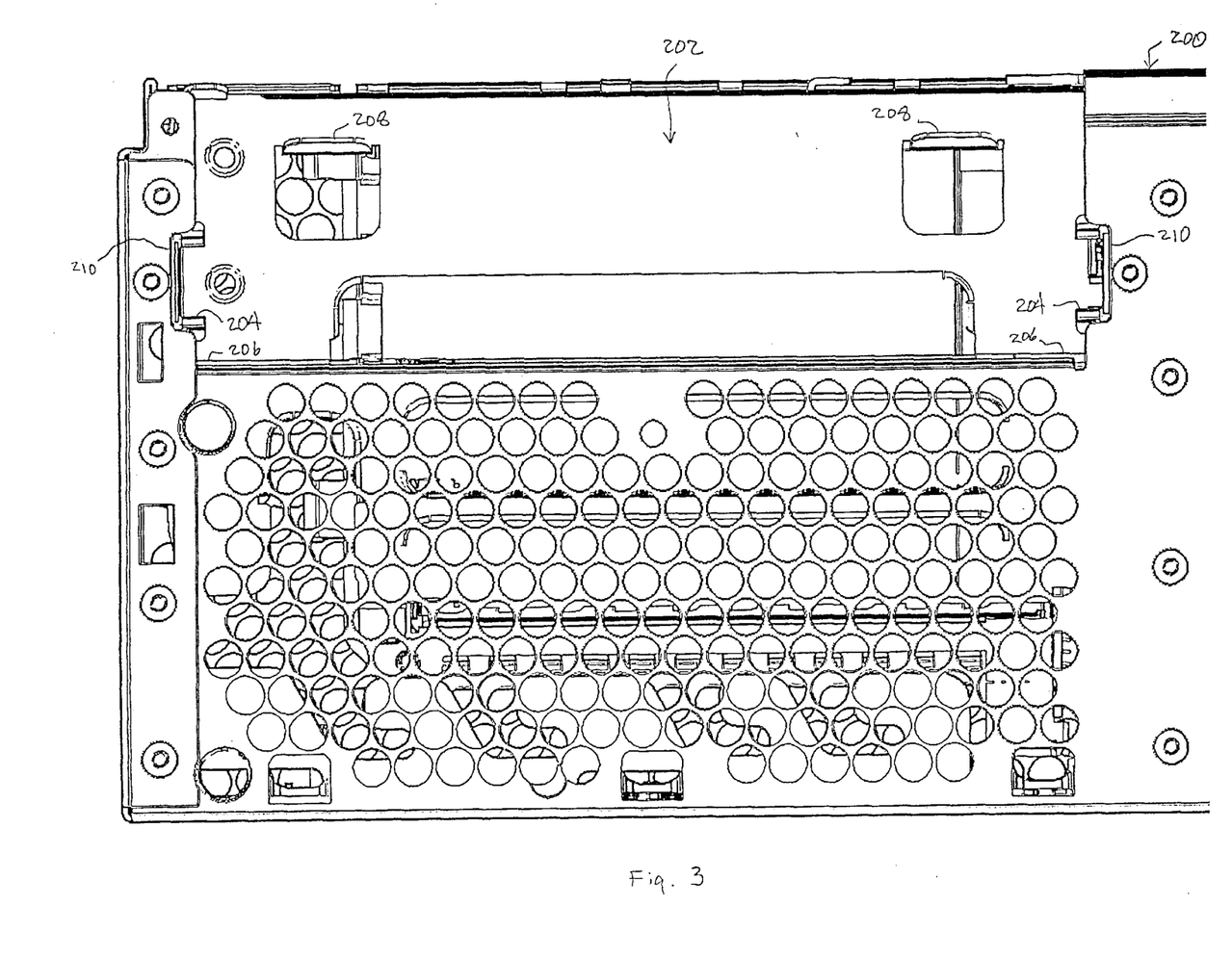
FIG. 3 is a front view of the media drive bay of FIG. 2.
Figure 4:
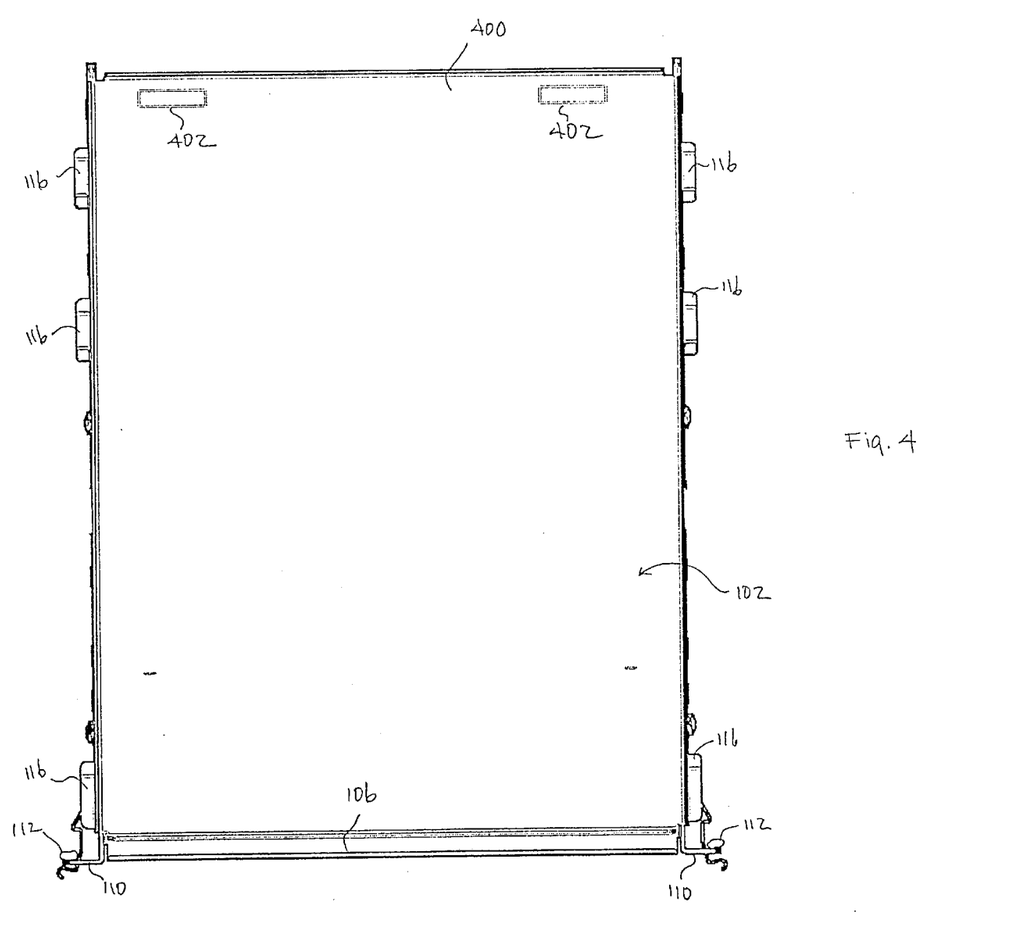
FIG. 4 is a top view of the media drive housing of FIG. 1, illustrated with the media drive removed.
Figure 5:
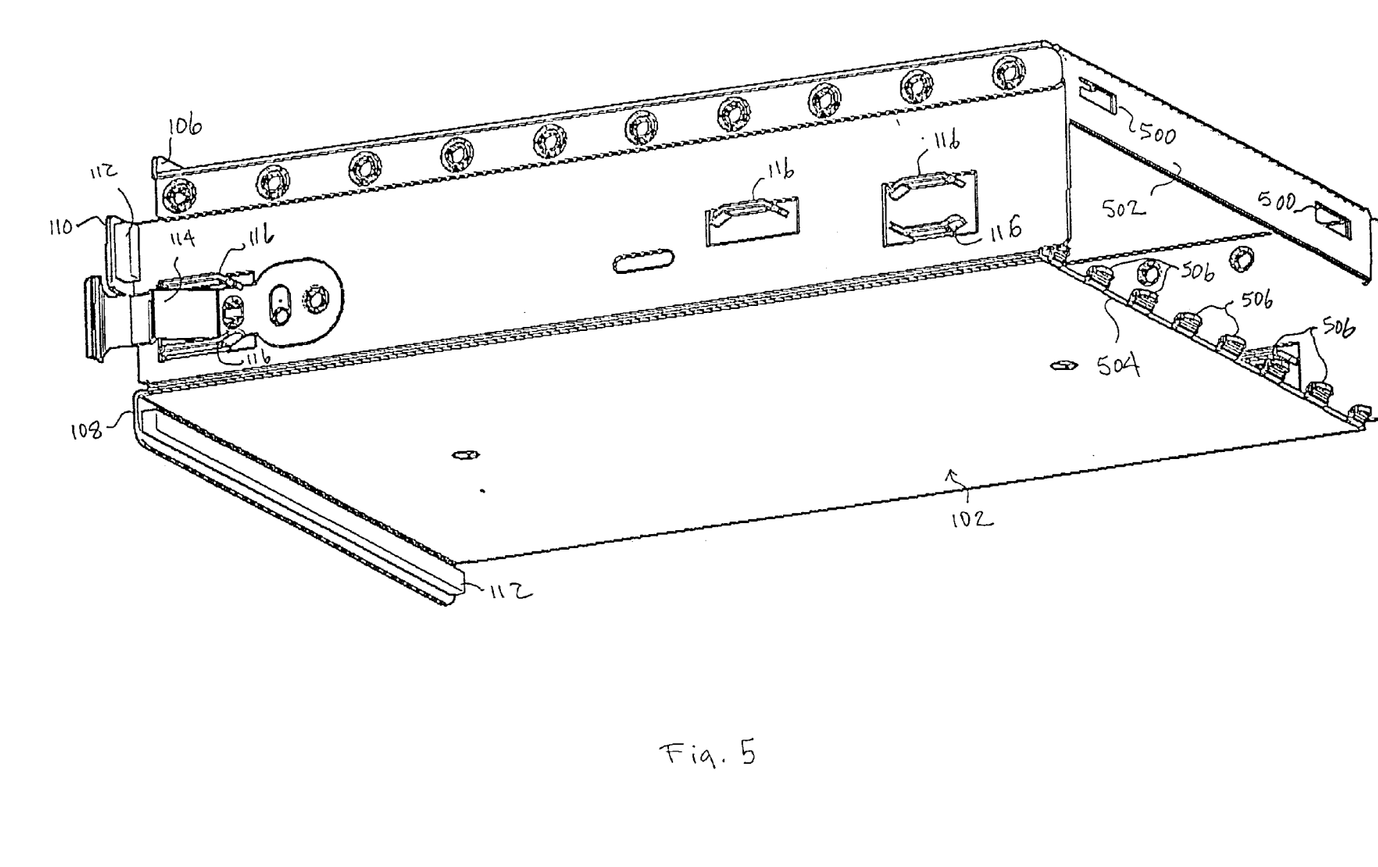
FIG. 5 is an oblique view of the media drive housing of FIG. 1, illustrated with both the media drive and the EMI cover removed.

As shown in FIGS. 1 and 4, housing catches 114 may be provided on the left and right sides of the front end of housing 102, and tabs 116 may be provided along the left and right sides of housing 102. Housing 102 may be inserted into a media bay 202 within a computer enclosure 200. (See FIGS. 2 and 3.) Guides 204 and supports 206 may be provided on the left and right sides of bay 202 for engaging tabs 116 to facilitate insertion and removal of housing 102 and to support the bottom of housing 102 while it is resident within enclosure 200. End tabs 208 may be provided at the back end of bay 202. When housing 102 is fully inserted in bay 202, end tabs 208 extend through holes 120 in cover 100 into end tab holes 500 formed at the back end of housing 102. (See FIG. 5.) End tabs 208 serve to hold housing 102 down against supports 206 while it is resident within media bay 202. They also provide lateral stability for housing 102 while it is resident in bay 202. Catches 114 may releasably engage holes 210 formed on either side of the mouth of media bay 202 to help retain housing 102 therein. When housing 102 is installed in enclosure 200 with EMI cover 100 in place, the EMI escape paths represented by media bay 202 are restricted by conductive material. This is so regardless of whether housing 102 is populated with a media drive 104.

Figure 6:
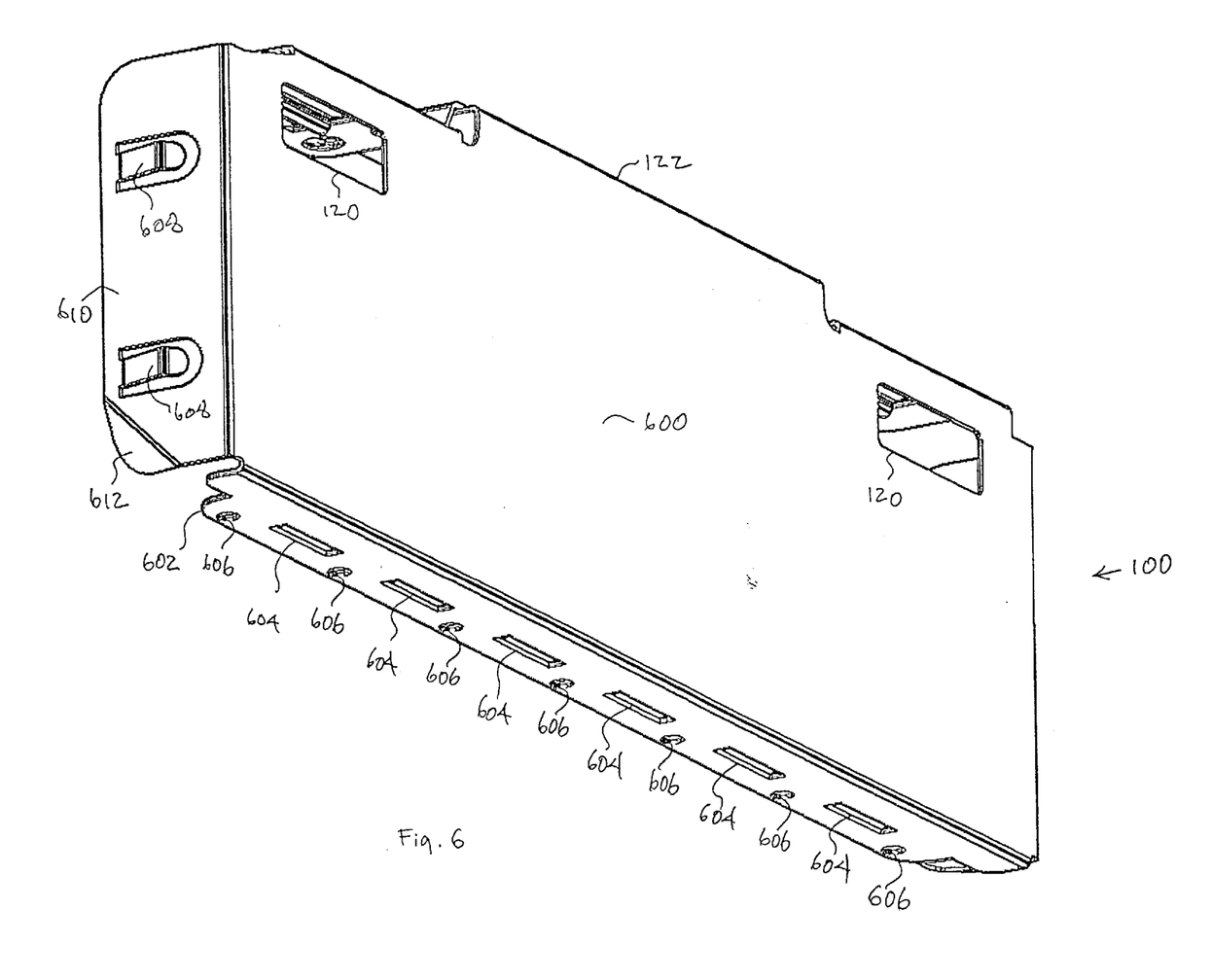
FIGS. 6 and 7 are back and front oblique views, respectively, of the removable EMI cover of FIG. 1.
Figure 7:
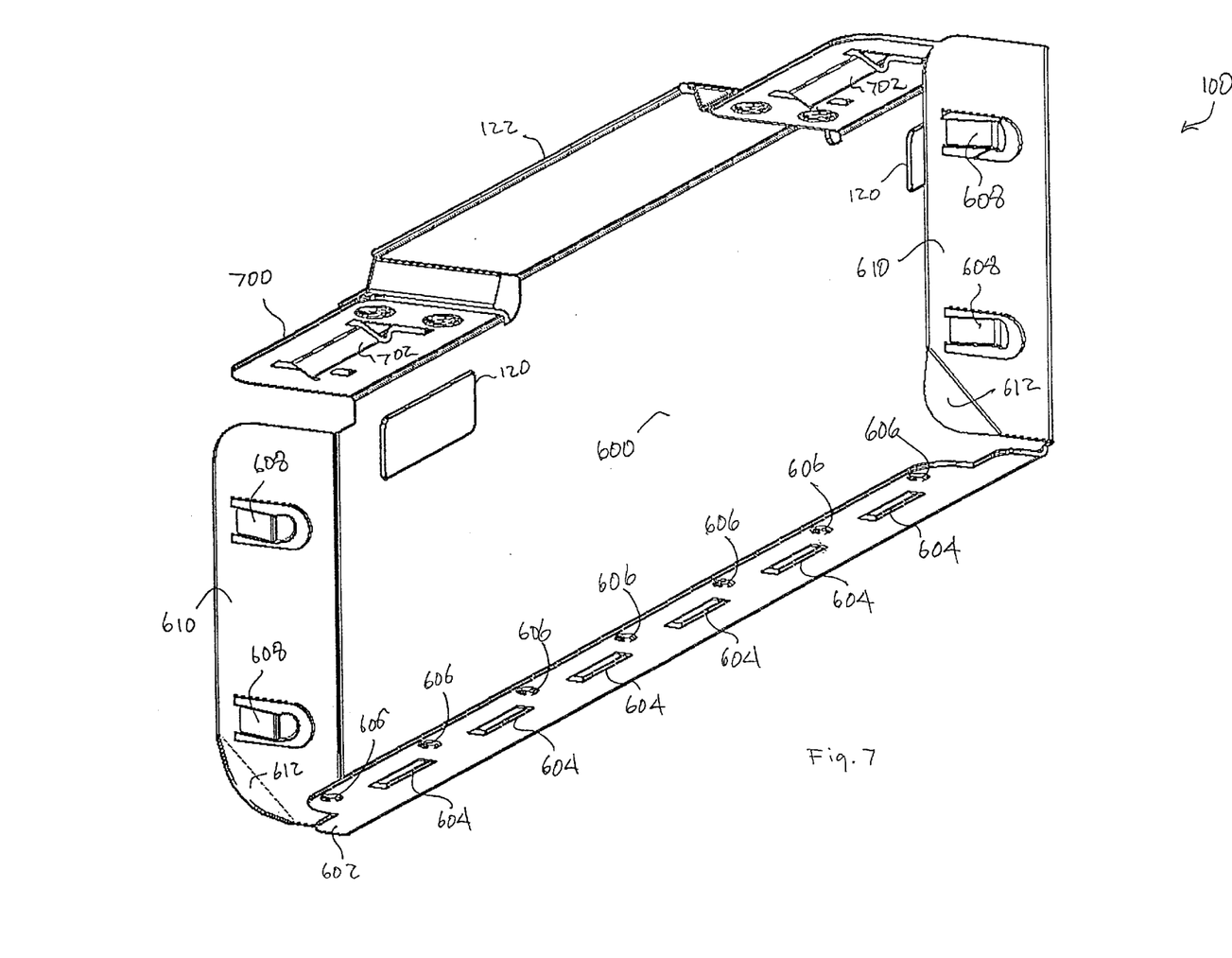
Figure 8:
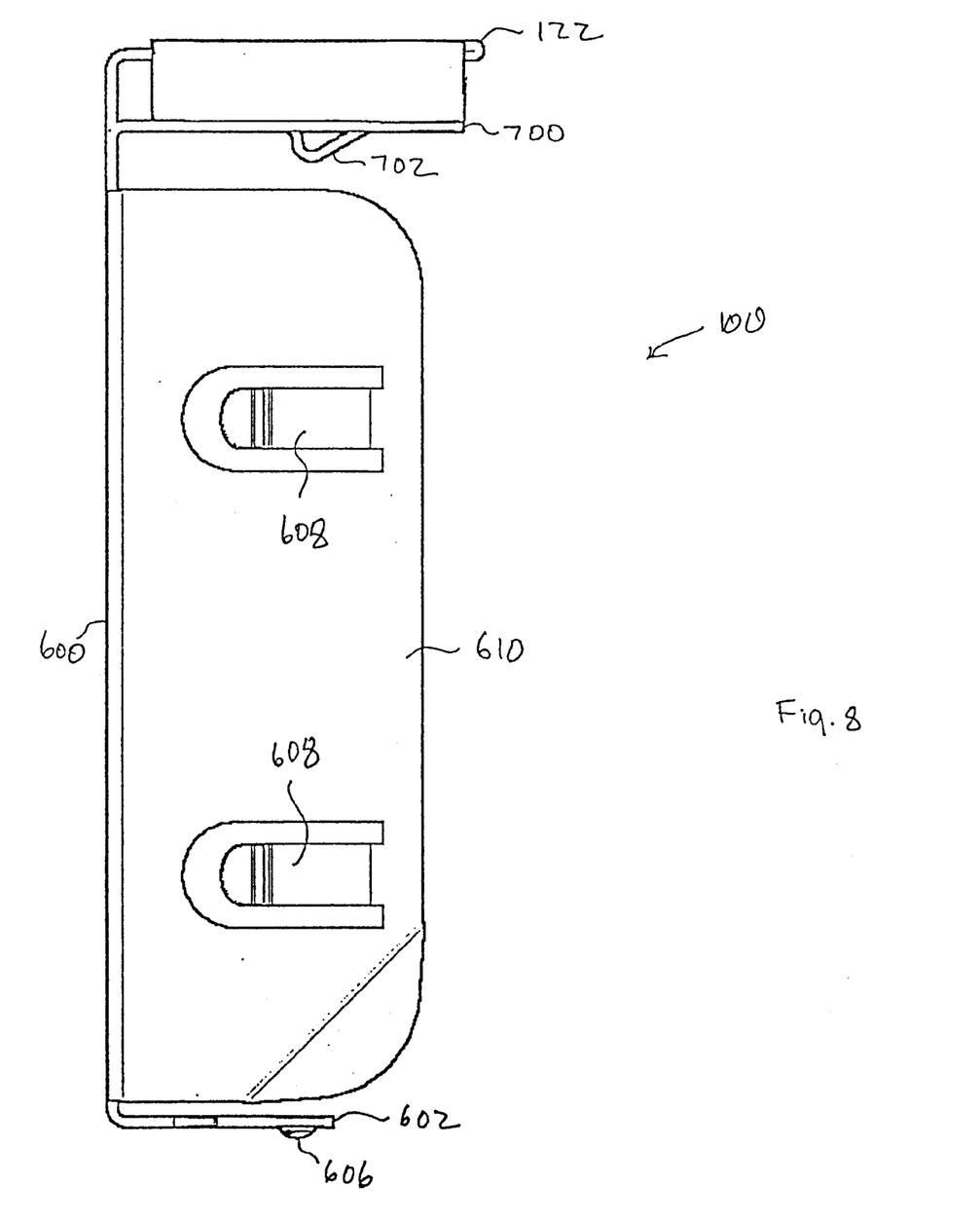
FIG. 8 is a side view of the EMI cover of FIG. 1.

FIGS. 6–8 provide a more detailed view of EMI cover 100. Cover 100 includes a conductive surface 600 adapted to cover the end of media drive housing 102. A conductive flange 602 is disposed along one edge of surface 600 as shown. Flange 602 is adapted to hingingly engage surface 504 on the back end of housing 102. (See FIG. 5.) In the embodiment shown, the hinging engagement is accomplished when a linear array of holes 604 engages corresponding teeth 506 formed on surface 504. Alternatively, a linear array of holes may be formed on surface 504, and corresponding teeth may be formed on flange 602. (To facilitate installation of cover 100 on housing 102, flanges 610 may be bent inward at the corners 612 nearest flange 602. In this manner, flanges 610 tend to guide themselves to the inside of housing 102 as the installer aligns holes 604 with teeth 506. In an alternative embodiment, flanges 610 may be designed to fit just outside of, rather than inside of, the left and right sides of housing 102. In such an embodiment, corners 612 may be bent toward the outside of housing 102.)

Another conductive flange 700 is disposed along another edge of surface 600 as shown. Flange 700 is adapted to catchingly engage surface 400 on the back end of housing 102. (See FIG. 4.) In the embodiment shown, the catching engagement is accomplished when two detents 702 on flange 700 engage corresponding holes or recesses 402 formed on surface 400. Alternatively, detents 702 may be formed on surface 400, and corresponding holes or recesses 402 may be formed on flange 700.

In the embodiment shown, flanges 602 and 700 are disposed parallel to and opposite one another. In alternative embodiments, flanges 602 and 700 may be disposed adjacent to one another.

To enhance the EMI-blocking characteristics of cover 100, conductive protrusions may be added to one or more of the flanges and adapted to make electrical contact with the conductive housing 102. In the embodiment shown, such conductive protrusions take the form of bumps 606 disposed along the length of flange 602, and resilient fingers 608 formed on conductive left and right side flanges 610. If EMI cover 100 is formed from sheet metal, then bumps 606 and resilient fingers 608 may be created using conventional punch and form techniques. Preferably, fingers 608 are biased toward the outside of cover 100, as shown, so that they positively engage corresponding inside surfaces of housing 102.

Figure 9:
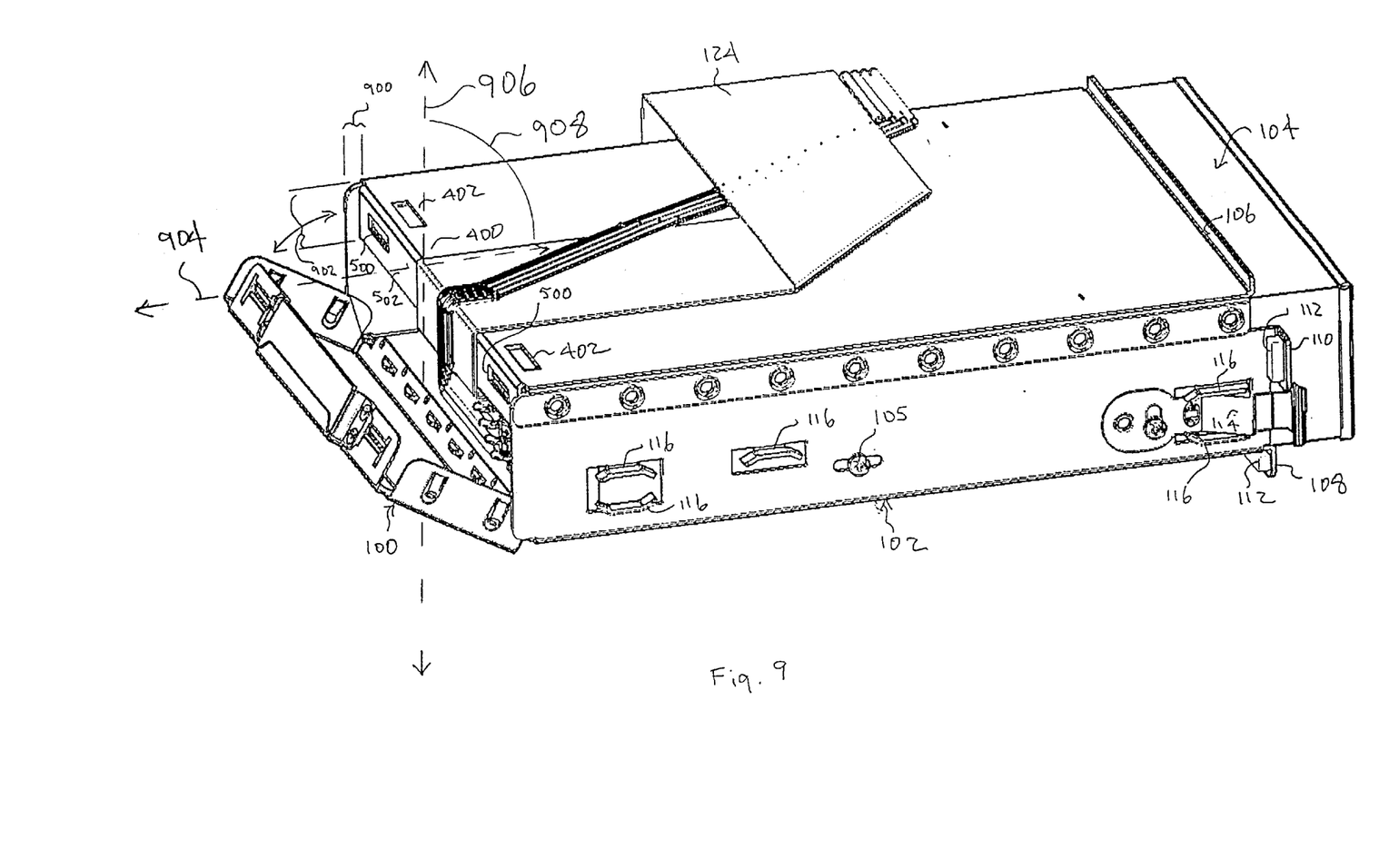
FIG. 9 is an oblique view of the media drive housing of FIG. 1, illustrated with the EMI cover partially removed.
Figure 10:
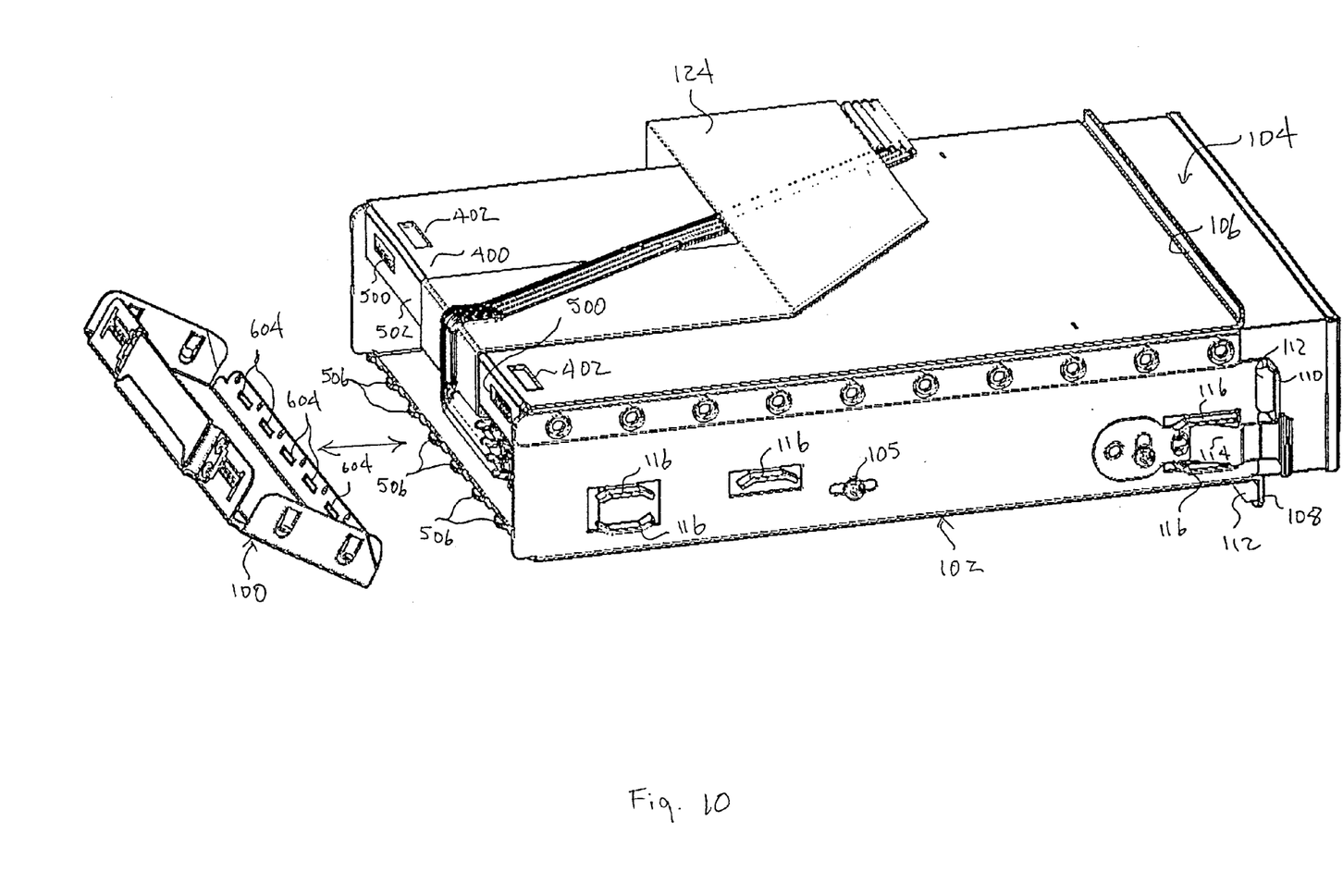
FIG. 10 is an oblique view of the media drive housing of FIG. 1, illustrated with the EMI cover completely removed.

To remove cover 100 from housing 102, detents 702 are released from holes 402 and cover 100 is rotated away from surface 400 as shown in FIG. 9. (In the embodiment shown, detents 702 may be released by hand simply by pulling up on flange 700, which is somewhat resilient.) Then, holes 604 may be disengaged from teeth 506 and pulled away from housing 102 as shown in FIG. 10. To install cover 100 onto housing 102, the process is reversed.

A cable management port may be provided as follows without substantially impairing the EMI-blocking characteristics of cover 100 and housing 102: A raised section 122 may be formed on one or more of the flanges of cover 100. In the embodiment shown, raised section 122 is formed on flange 700. Raised section 122 is adapted to clear a cable assembly 124 that exits from the back end of housing 102 and wraps over surface 400 of housing 102. In order to enhance the EMI-blocking characteristics of cover 100 and housing 102, preferably raised section 122 and the portion of surface 400 over which it passes define a first channel whose width 126 and height 128 are just large enough to clear cable assembly 124, but are not substantially larger. Sizing the first channel in this manner tends to cause impedance changes at the entrance and at the exit of the channel. Such impedance changes help to reduce the transmission of EMI through the channel.

A second channel having length 902 may be formed by the space between conductive cable flange 502 at the back end of housing 102 and the portion of surface 600 that is adjacent to flange 502 when cover 100 is installed. Preferably, flange 502 is set back from the end of housing 102 by a distance 900 (the height of the channel) that is just large enough to clear cable assembly 124. When cover 100 is installed on the end of housing 102, the first and second channels meet end-to-end to form a combined channel through which cable assembly 124 may pass. To further enhance the EMI-blocking characteristics of cover 100 and housing 102, the angle 908 between the axes 904, 906 of the first and second channels should preferably be at least 90 degrees. In this manner, EMI propagation through the combined channel is reduced due to angular reflection, especially when housing 102 is not populated with a media drive or cable assembly.

What is claimed is:

1. An EMI cover for use on a conductive media drive housing, comprising:
   a conductive surface adapted to cover one end of the housing;
   first and second conductive flanges disposed along first and second edges, respectively, of the surface;
   a hinge member on the first flange that engages a corresponding hinge member on a first surface on the one end of the housing;
   a catch member on the second flange that engages a corresponding catch member on a second surface on the one end of the housing; and plural conductive protrusions formed on at least one of the first and second flanges and adapted to make electrical contact with the media drive housing when the cover is installed thereon.

2. The EMI cover of claim 1, wherein:
the hinge member on the first flange comprises a linear array of holes; and
the corresponding hinge member on the first surface on the one end of the housing comprises teeth formed on the first surface.

3. The EMI cover of claim 1, wherein:
the hinge member on the first flange comprises a linear array of teeth; and
the corresponding hinge member on the first surface on the one end of the housing comprises holes formed on the first surface.

4. The EMI cover of claim 1, wherein:
the catch member on the second flange comprises a detent; and
the corresponding catch member on the second surface on the one end of the housing comprises a hole formed on the second surface.

5. The EMI cover of claim 1, wherein:
the catch member on the second flange comprises a hole; and
the corresponding catch member on the second surface on the one end of the housing comprises a detent formed on the second surface.

6. The EMI cover of claim 1, wherein:
the first and second flanges are parallel to and opposite one another.

7. The EMI cover of claim 1, wherein:
the plural conductive protrusions comprise bumps formed on the first flange.

8. The EMI cover of claim 1, wherein:
the plural conductive protrusions comprise resilient fingers formed on the second flange and biased outward.

9. The EMI cover of claim 1, further comprising:
a raised section on at least one of the first and second flanges adapted to clear a cable assembly that exits the media drive housing from the one end and wraps over a portion of an outer surface of the housing.

10. The EMI cover of claim 9, wherein:
the raised section and the portion of the outer surface of the housing define a first channel that is wide enough and high enough to clear the cable assembly, and that is not substantially higher or wider than the cable assembly.

11. The EMI cover of claim 10, further comprising:
a cable flange formed at the one end of the media drive housing parallel to the surface of the EMI cover such that a second channel is defined between the cable flange and a portion of the surface;
wherein the channel is wide enough and high enough to clear the cable assembly; and
wherein the first and second channels end-to-end form a combined channel having at least a 90-degree bend therein.

12. The EMI cover of claim 1, further comprising:
a cable flange formed at the one end of the media drive housing parallel to the surface of the EMI cover such that a channel is defined between the cable flange and a portion of the surface; and
wherein the channel is wide enough and high enough to clear a cable assembly that exits the media drive housing from the one end.

13. The EMI cover of claim 1, further comprising:
third and fourth flanges disposed along third and fourth edges, respectively, of the surface such that the first edge is between the third and fourth edges, and such that the third and fourth flanges are parallel to first and second sides of the housing;
wherein each of the third and fourth flanges has a corner nearest the first flange; and
wherein the corners of the third and fourth flanges nearest the first flange are bent away from the first and second sides of the housing.

14. The EMI cover of claim 13, wherein: the corners are bent inward.

15. The EMI cover of claim 13, wherein: the corners are bent outward.

16. An EMI cover for use on a conductive media drive housing, comprising:
a conductive surface adapted to cover one end of the housing;
first and second conductive flanges disposed along first and second edges, respectively, of the surface;
a hinge member on the first flange that engages a corresponding hinge member on a first surface on the one end of the housing;
a catch member on the second flange that engages a corresponding catch member on a second surface on the one end of the housing;
a raised section on at least one of the first and second flanges adapted to clear a cable assembly that exits the media drive housing from the one end and wraps over a portion of an outer surface of the housing, wherein the raised section and the portion of the outer surface of the housing define a first channel that is wide enough and high enough to clear the cable assembly, and that is not substantially higher or wider than the cable assembly; and
a cable flange formed at the one end of the media drive housing parallel to the surface of the EMI cover such that a second channel is defined between the cable flange and a portion of the surface, wherein the second channel is wide enough and high enough to clear the cable assembly.

17. The EMI cover of claim 16, wherein:
the hinge member on the first flange comprises a linear array of holes; and
the corresponding hinge member on the first surface on the one end of the housing comprises teeth formed on the first surface.

18. The EMI cover of claim 16, wherein:
the hinge member on the first flange comprises a linear array of teeth; and
the corresponding hinge member on the first surface on the one end of the housing comprises holes formed on the first surface.

19. The EMI cover of claim 16, wherein:
the catch member on the second flange comprises a detent; and
the corresponding catch member on the second surface on the one end of the housing comprises a hole formed on the second surface.

20. The EMI cover of claim 16, wherein:
the catch member on the second flange comprises a hole; and
the corresponding catch member on the second surface on the one end of the housing comprises a detent formed on the second surface.

21. The EMI cover of claim 16, wherein:

the first and second flanges are parallel to and opposite one another.

22. The EMI cover of claim 16, wherein:

the first and second channels end-to-end form a combined channel having at least a 90-degree bend therein.

23. The EMI cover of claims 16, further comprising:

third and fourth flanges disposed along third and fourth edges, respectively, of the surface such that the first edge is between the third and fourth edges, and such that the third and fourth flanges are parallel to first and second sides of the housing;

wherein each of the third and fourth flanges has a corner nearest the first flange; and wherein the corners of the third and fourth flanges nearest the first flange are bent away from the first and second sides of the housing.

24. The EMI cover of claim 23, wherein:

the corners are bent inward.

25. The EMI cover of claim 23, wherein:

the corners are bent outward.

* * * * *